United States Patent [19]
Hernandez

[11] Patent Number: 4,781,408
[45] Date of Patent: Nov. 1, 1988

[54] COVER TOOL REMOVAL

[75] Inventor: Louis P. Hernandez, Central Islip, N.Y.

[73] Assignee: Eaton Corporation, Cleveland, Ohio

[21] Appl. No.: 125,977

[22] Filed: Nov. 27, 1987

[51] Int. Cl.[4] ...................... H05K 13/04; A61B 17/04
[52] U.S. Cl. ..................................... 294/99.2; 294/33; 294/106; 294/902
[58] Field of Search ...................... 294/99.2, 33, 6, 8.5, 294/11, 25, 902, 106; 128/321, 354

[56] References Cited
U.S. PATENT DOCUMENTS 3,317,989  5/1967  Cull ..................................... 294/99.2
4,666,199  5/1987  Chen .................................... 294/99.2

Primary Examiner—James B. Marbert
Attorney, Agent, or Firm—A. E. Chrow

[57] ABSTRACT

A hand tool (40) is provided for removing a cover (2) from a package (4), such as an electronic circuitry package, having respective adjacent facing surfaces (22) and (23) on opposite sides thereof. Tool (40) has a pair of spaced-apart resilient arms (8) and (10) having respective free-ends (14) and (16) provided with jaw members (24) respectively having a lip (18) operative to engage surface (22) and provide support for cover (2) and are further adapted to provide a wedging action between surfaces (22) and (23) effective to urge cover (2) away from package (4) when arms (8) and (10) are contracted towards each other. Arms (8) and (10) are additionally provided with resilient biasing means (26) on facing surfaces effective to prevent lips (18) from engaging surface (22) when arms (8) and (10) are in a relaxed condition to facilitate removal of cover (2) from tool (40) and to impart a biasing force $F_c$ against opposite sides (20) of cover (2) when arms (8) and (10) are contracted towards each other.

5 Claims, 1 Drawing Sheet

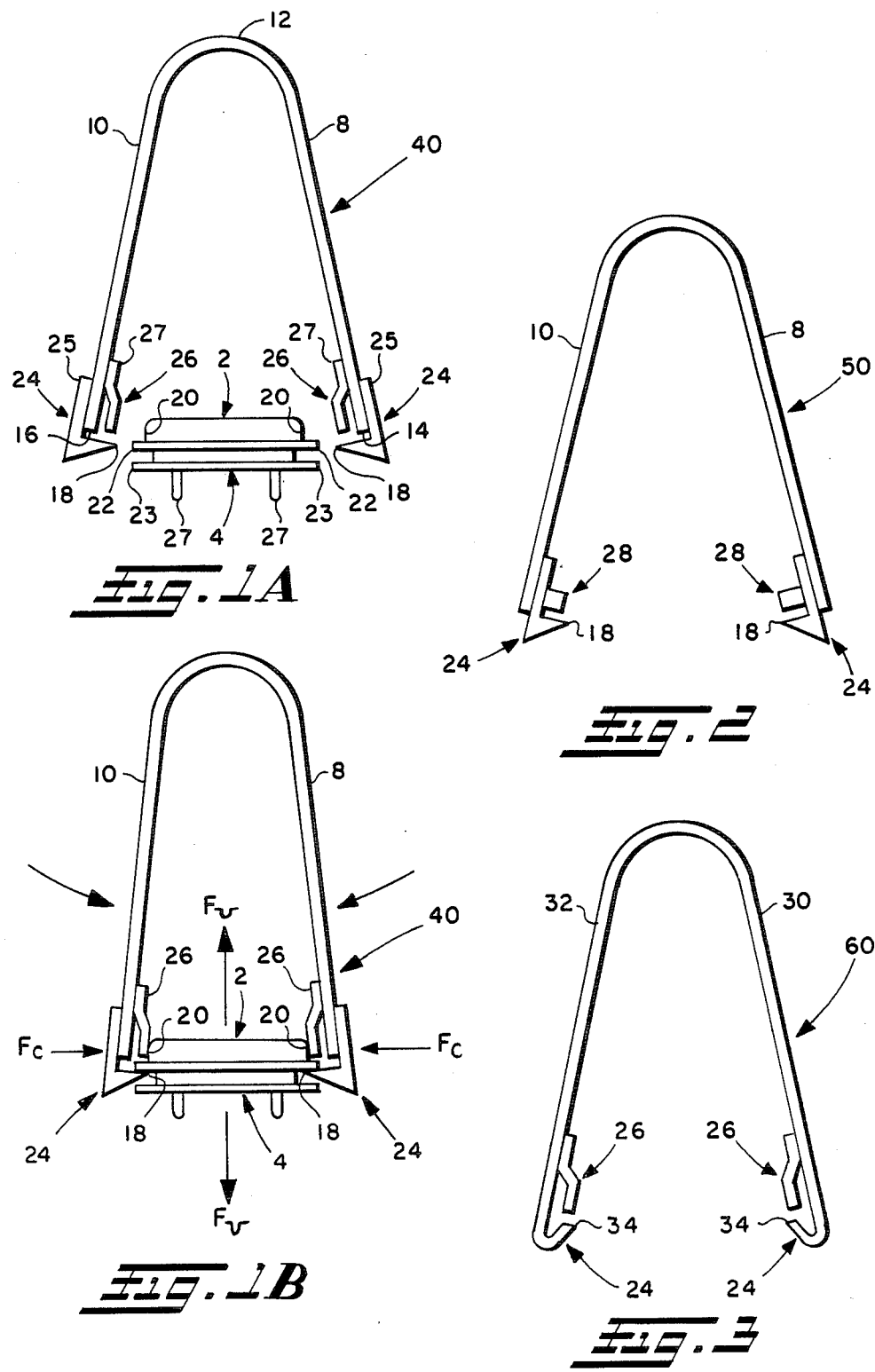

COVER TOOL REMOVAL

INTRODUCTION

This invention relates generally to a hand tool for removing a cover from a member such as an electronic package and more particularly where the cover and package have adjacent facing surfaces on opposite sides and the tool is provided with a pair of spaced-apart resilient arms having jaw members having a lip operative to engage the cover's facing surface to provide support therefor upon removing the cover from the package and is also operative to provide a wedging action between the cover and package facing surfaces effective to urge the cover away from the package upon contraction of the arms towards each other and is further provided with biasing means operative to apply a resilient clamping force against the opposite sides of the cover when the tool arms are contracted together and to prevent the lips from engaging the cover facing surfaces when the tool is in a relaxed condition to facilitate removal of the cover from the tool.

BACKGROUND OF THE INVENTION

A variety of hand tools have been devised over the years for facilitating removal of one member from another. Criticality in design of such tool has been particularly addressed in the electronics industry due to problems such as pin alignment, contamination, fragility of parts and the like.

An example of a hand tool particularly designed to remove an integrated circuit package from a circuit board is disclosed in U.S. Pat. No. 3,974,556, the disclosure of which is incorporated herein by reference. The tool, however, involves both a sliding and clamping action and appears to require two hands to operate.

Another example of a hand tool for removing circuit packs from a printed circuit board is disclosed in U.S. Pat. No. 4,034,202, the disclosure of which is incorporated herein by reference. The tool operates somewhat like tweezers with each tweezer arm provided with an end adapted to melt the solder securing the pins of the pack to the board whilst gripping the pins for removal of the pack from the board.

Yet another tool particularly adapted for inserting and removing electrical contacts from rear release connections is disclosed in U.S. Pat. No. 4,351,109, the disclosure of which is incorporated herein by reference. The tool features a pair of pivotable arms that spread apart when contracted together at the opposite end.

Still another tweezer-like tool for removing pin components from a circuit board is disclosed in U.S. Pat. No. 4,389,912, the disclosure of which is incorporated herein by reference. The arms of the tweezers are shaped or provided with hooks for grasping the edge of the pin holder when the arms are contracted together and optional additional pins are provided that extend through the arm and trap the pin holder between the pin and the hooks.

Finally, yet another hand tool for pulling fuses is disclosed in U.S. Pat. No. 4,475,283, the disclosure of which is incorporated herein by reference. The puller involves a pair of resilient arms that operate to grip the fuse holder when compressed together for insertions and removal.

None of the above tools, however, operate in the manner provided by the tool of the present invention which is simple and economical to manufacture, is easily operated by one hand, and is not only provided with jaw members for providing support as the cover is removed by the tool but is also provided with biasing means adapted to impart a resilient clamping force against the sides of the cover when contracted to minimize damage thereto in addition to preventing the jaws from engaging the cover when in a relaxed condition to facilitate removal of the cover from the tool.

SUMMARY OF THE INVENTION

Accordingly, it is an object of this invention to provide a hand tool for removing a cover from a member such as an electronic package such as a circuit board in a simple and effective manner.

It is another object of this invention to provide a hand tool for removing a cover from a member such as an electronic package that is simple and economical to manufacture and highly effective in preventing damage to the cover that might otherwise be caused by contracting the tool too tightly.

It is still another object of this invention to provide a hand tool for removing a cover from a member such as an electronic package that in addition to having jaw members for supporting the cover as it is removed by the tool is additionally provided with resilient biasing means that impart a resilient holding or clamping force against the cover when the arms of the tool are contracted towards each other to prevent damage thereto that might result by contracting the arm too tightly in addition to preventing the jaw member from engaging the cover when in a relaxed condition facilitating removal of the cover from the tool.

BRIEF DESCRIPTION OF THE DRAWING

FIG. 1A is a side elevation view of an embodiment 40 of the tool of the invention in a relaxed condition straddling a cover 2 to be removed thereby;

FIG. 1B is a side elevation of tool 40 of FIG. 1A in the process of removing cover 2 after having been contracted;

FIG. 2 is a side elevation view of a tool 50 of the invention that features different biasing means than that associated with tool 40 of FIGS. 1A and 1B; and FIG. 3 is a side elevation view of a tool 60 of the invention having another embodiment of jaw members.

DETAILED DESCRIPTION OF SOME PREFERRED EMBODIMENTS

In FIG. 1A, tool 40 has a pair of arms 8 and 10 that are resiliently joined together at one end referenced generally by numeral 12. Preferably, arms 8 and 10 are integral with each other and bent into the "U" configuration to provide the resilient junction therebetween as shown in the FIGURES. Thus, arms 8 and 10 provide a tweezer action by resiliently returning to their expanded position after having been contracted towards each other by hand pressure which is then relaxed.

Arms 8 and 10 have respective free ends 14 and 16 at the opposite ends thereof that are spaced-apart from each other for a distance sufficient to enable cover 2 to be straddled thereby.

Arms 8 and 10 are made from a suitably resilient metal or plastic or plastic coated metal or other composite material providing the resiliency and other properties desired. Arms 8 and 10 may have a rectangular cross section or other cross sectional configuration that may enhance their resiliency such as oval, channel or "H" configuration.

Cover 2 is a cover for package 4. Package 4 may be an electronic package containing hybrid microelectronic circuitry having pins 27 for mounting on a circuit board or the like for which great delicacy must be exercised in removing cover 2 from package 4 to prevent damage from occurring to the circuitry.

Cover 2 and package 4 have respective adjacent facing surfaces 22 and 23 on opposite sides thereof with the opposite sides of cover 2 referenced by the numeral 20.

A jaw member 24 is respectively provided at the opposite free-ends of arms 8 and 10. Preferably, jaw members 24 are releasably secured to arms 8 and 10 such as by suitable screws (not shown). Each of jaw members 24 have a portion 25 adapted to enable them to be respectively secured adjacent opposite free-ends 14 and 6. For tool 40 shown in FIG. 1A, portions 25 of jaw members 24 are respectively secured to the side of arms 8 and 10 facing away from each other. Jaw members 24 are further provided with a lip 18 operative to respectively engage surface 22 of cover 2 when arms 8 and 10 are contracted as shown in FIG. 1B to assist in lifting cover 2 away from package 4.

Arms 8 and 10 are respectively provided with resilient biasing means such as leaf springs 26 mounted in facing relationship to each other as shown in FIG. 1A. Leaf springs 26 have one end 27 secured to arms 8 and 10 respectively and thence respectively cantilever towards each other away from arms 8 and 10 and towards their respective opposite free-ends 14 and 16 to opposite ends (not referenced) which preferably are in substantial registration with lips 18 of jaw members 24 as shown in FIG. 1A when arms 8 and 10 are in a relaxed condition.

In FIG. 1B, arms 8 and 10 of tool 40 have been contracted together by hand to enable leaf springs 26 to respectively engage opposite sides 20 of cover 2 and, upon further contraction, be respectively compressed towards arms 8 and 10 to impart a resilient clamping force $F_c$ upon cover 2 as shown in FIG. 1B. The compression of leaf springs 26 also enables lips 18 of jaw members 24 to engage surface 22 of cover 2 and support cover 2 as it is lifted away from package 4. Jaw members 24 are also shaped to provide a wedging action between surfaces 22 and 23 that imparts opposite vertical forces $F_v$ thereupon effective to urge cover 2 from package 4 when arms 8 and 10 are contracted towards each other.

Upon removing cover 2 from package 4, relaxation of arms 8 and 10 will cause the cantilevered ends of leaf springs 26 to expand towards each other whilst at the same time enabling lips 18 to disengage from facing surfaces 22 which greatly enhances removal of tool 40 from cover 2 for placing it at another location or for removing tool 40 from cover 2 after it has been replaced on package 4.

The bottom of jaw members 24 are each preferably tapered downwardly away from lip 18 and from each other to provide each with a wedge shaped configuration effective to provide the wedging action operative to urge cover 2 from package 4 when arms 8 and 10 are squeezed towards each other.

FIG. 2 shows a tool 50 made in accordance with the invention having spaced-apart free-ended arms 8 and 10 resiliently joined together at one end to provide a "U" shaped configuration. Tool 50 differs from tool 40 by having jaw members 24 secured on the sides of arms 8 and 10 facing towards each other adjacent the respective free-ends thereof as well as having resilient biasing means 28 respectively mounted on arms 8 and 10 in facing relationship to each other that, rather than being a leaf spring, may be a pad made from a resilient material such as rubber to illustrate that the resilient biasing means may be of type or kind, including coiled springs, provided it operates in the manner required.

FIG. 3 shows a tool 60 made in accordance with the invention having spaced-apart arms 30 and 32 resiliently joined at one end to provide a "U" shaped configuration but rather than having separate jaw members 24 secured to their free-ends, the jaw members are formed by shaping the free-ends themselves into jaw members 24 having respective lips 34 which coact and preferably register with the cantilevered end of biasing means 26 as shown in FIG. 3 when tool 60 is in the relaxed condition and further are provided with a wedge shaped configuration operative to urge cover 2 from package 4 when arms 32 and 34 are contracted together.

Tools made in accordance with the invention may be made from any suitable material or materials. For example, the arms may be made from plastic coated metal with the metal preferably having a channel shaped cross-section whilst the jaw members, if separate, are made from an electrical insulating material such as nylon and the biasing means, if leaf springs, made from copper.

What is claimed is:

1. A tool for removing a package cover, said cover and package when assembled having adjacent facing surfaces on opposite sides thereof and said tool comprising;

a pair of arms resiliently joined together at one end and which extend therefrom to respective opposite free-ends which, in a relaxed condition, are spaced apart from each other a distance sufficient for straddling the cover therebetween;

a jaw member provided at the opposite free-end of each arm, said jaw members having a lip operative to engage the cover facing surface adjacent thereto upon contraction of the arms towards each other and provide support for the cover as it is removed from the package.

said jaw members having respective bottom surfaces that taper from the lip angularly downwardly away from each other to provide each jaw member with a wedge-shaped configuration operative to provide a wedging action between the cover and package facing surfaces effective to urge the cover and package apart upon contraction of the arms towards each other; and resilient biasing means provided on each of the arms in facing relationship to each other, said biasing means operative to engage the side of the cover adjacent thereto and impart a resilient clamping force thereagainst in a compressed condition caused by contraction of the arms towards each other and to prevent the jaw lip from engaging the cover facing surface when the arms are in the relaxed condition to facilitate removal of the cover from the tool.

2. The tool of claim 1 wherein the arms have a "U" shaped configuration with the one end respectively thereof integral with each other to provide the resilient junction therebetween.

3. The tool of claim 1 wherein the biasing means comprises a leaf spring secured at one end to the respective arms and thence cantilevered therefrom in a manner preventing the jaw lips from engaging the cover facing surface when in the relaxed condition.

4. The tool of claim 1 wherein the biasing means comprises a leaf spring secured at one end to the arm and thence cantilever away therefrom to an opposite end that is in substantial registration with the lip of the jaw member when the arms are in the relaxed condition.

5. The tool of claim 1 wherein at least the jaw members are made from an electrically insulating material.

* * * * *